United States Patent
Kusama et al.

(10) Patent No.: US 9,560,768 B2
(45) Date of Patent: *Jan. 31, 2017

(54) WIRING SUBSTRATE AND METHOD OF MAKING WIRING SUBSTRATE

(71) Applicant: SHINKO ELECTRIC INDUSTRIES CO., LTD., Nagano (JP)

(72) Inventors: Yasuhiko Kusama, Nagano (JP); Hideyuki Tako, Nagano (JP); Kenji Kawai, Nagano (JP); Fumihisa Miyasaka, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/634,972

(22) Filed: Mar. 2, 2015

(65) Prior Publication Data
US 2015/0257275 A1     Sep. 10, 2015

(30) Foreign Application Priority Data
Mar. 5, 2014  (JP) .................. 2014-043317

(51) Int. Cl.
  *H05K 1/16*  (2006.01)
  *H05K 1/18*  (2006.01)
  *H05K 3/46*  (2006.01)

(52) U.S. Cl.
  CPC ............ *H05K 1/185* (2013.01); *H05K 3/4697* (2013.01); *H01L 2224/16227* (2013.01); *H01L 2224/32225* (2013.01); *H01L 2224/73204* (2013.01); *H01L 2924/15313* (2013.01); *H05K 3/4602* (2013.01); *H05K 2201/09972* (2013.01)

(58) Field of Classification Search
  CPC .................. H05K 3/4697; H05K 2201/09072; H05K 2201/09972; H05K 1/185
  See application file for complete search history.

(56) References Cited

U.S. PATENT DOCUMENTS

| 7,876,577 | B2* | 1/2011 | Weber | H05K 1/183 174/260 |
|---|---|---|---|---|
| 2011/0240354 | A1 | 10/2011 | Furuhata et al. | |
| 2012/0080221 | A1* | 4/2012 | Sekine | H05K 1/186 174/260 |
| 2012/0186861 | A1* | 7/2012 | Shimizu | H05K 1/185 174/255 |

(Continued)

FOREIGN PATENT DOCUMENTS

JP     2011-216740     10/2011

*Primary Examiner* — Chau N Nguyen
*Assistant Examiner* — Roshn Varghese
(74) *Attorney, Agent, or Firm* — IPUSA, PLLC

(57) ABSTRACT

A wiring substrate includes a core layer having a hole penetrating therethrough in a thickness direction thereof, and having a projecting part projecting from an inner wall of the hole toward an inner space of the hole, the projecting part being situated at a border that divides a plurality of areas in the hole, a plurality of electronic components disposed in the areas, respectively, the electronic components being arranged at a spaced interval with the projecting part therebetween, and a resin layer filling the hole and supporting the electronic components, wherein a thickness of the projecting part in the thickness direction of the core layer decreases toward a tip of the projecting part.

10 Claims, 9 Drawing Sheets

(56) References Cited

U.S. PATENT DOCUMENTS

| | | | |
|---|---|---|---|
| 2012/0287586 A1 | 11/2012 | Mikado et al. | |
| 2013/0182401 A1* | 7/2013 | Furutani | H05K 1/0296 361/782 |
| 2013/0192883 A1* | 8/2013 | Furutani | H05K 1/162 174/258 |
| 2013/0333930 A1* | 12/2013 | Koyanagi | H05K 1/184 174/260 |
| 2015/0014034 A1* | 1/2015 | Hwang | H05K 3/4697 174/260 |
| 2015/0068795 A1* | 3/2015 | Ida | H05K 3/4697 174/260 |
| 2015/0245492 A1* | 8/2015 | Shimabe | H01L 21/4857 361/761 |
| 2015/0257274 A1* | 9/2015 | Kusama | H05K 1/185 174/260 |
| 2015/0282305 A1* | 10/2015 | Shimabe | H05K 1/0284 174/255 |
| 2015/0334844 A1* | 11/2015 | Shimabe | H05K 1/185 361/761 |

* cited by examiner

WIRING SUBSTRATE AND METHOD OF MAKING WIRING SUBSTRATE

CROSS-REFERENCE TO RELATED APPLICATIONS

The present application is based upon and claims the benefit of priority from the prior Japanese Patent Application No. 2014-043317 filed on Mar. 5, 2014, with the Japanese Patent Office, the entire contents of which are incorporated herein by reference.

FIELD

The disclosures herein relate to a wiring substrate and a method of making a wiring substrate.

BACKGROUND

A certain type of wiring board is known in the art that has a substrate having a cavity formed therein and an electronic component disposed in the cavity. The wiring board further includes an insulating layer formed to cover the opening of the cavity (see Japanese Patent Application Publication No. 2011-216740, for example).

As described above, a related-art wiring board has a single electronic component disposed in a single cavity.

Placing a plurality of electronic components in a single cavity may give rise to a risk of causing the electronic components to be displaced at the time of filling an insulating layer in the cavity. Such displacement of the electronic components is associated with a risk of having short-circuit caused by physical contact or a risk of having a failure to secure connection with a wiring layer, thereby creating a problem regarding electrical reliability.

Accordingly, it may be desirable to provide a wiring substrate and a method of making the wiring substrate that ensure improved electrical reliability with respect to a plurality of electronic components disposed in a single penetrating hole.

SUMMARY

According to an aspect of the embodiment, a wiring substrate includes a core layer having a hole penetrating therethrough in a thickness direction thereof, and having a projecting part projecting from an inner wall of the hole toward an inner space of the hole, the projecting part being situated at a border that divides a plurality of areas in the hole, a plurality of electronic components disposed in the areas, respectively, the electronic components being arranged at a spaced interval with the projecting part therebetween, and a resin layer filling the hole and supporting the electronic components, wherein a thickness of the projecting part in the thickness direction of the core layer decreases toward a tip of the projecting part.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, a description will be given of embodiments of a wiring substrate and a method of making a wiring substrate.

Figure 1:
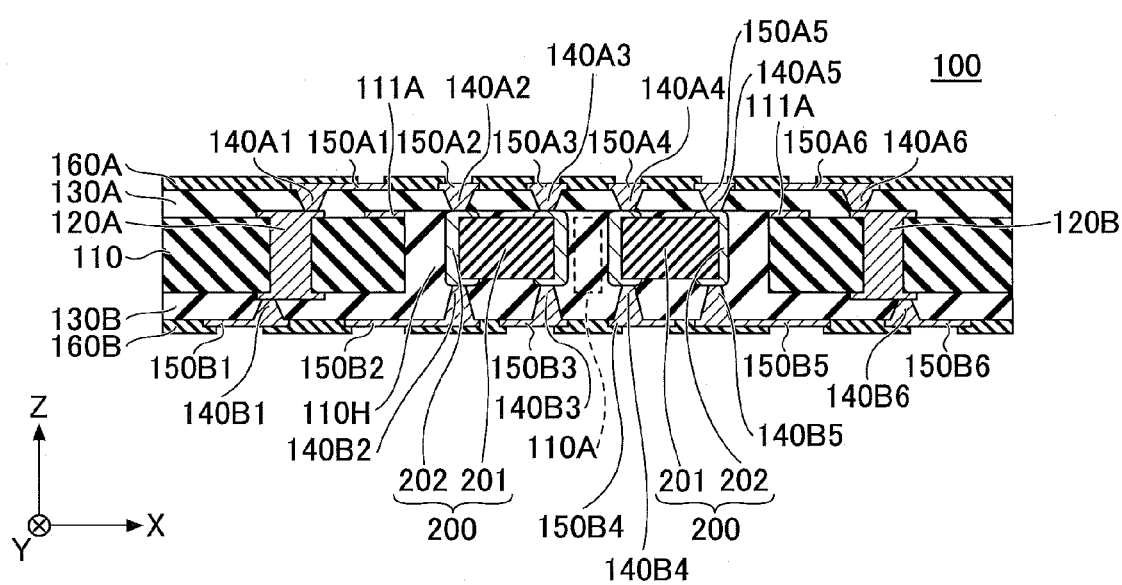
FIG. 1 is a cross-sectional view of a wiring substrate according to an embodiment.

FIG. 1 is a cross-sectional view of a wiring substrate 100 according to an embodiment. In the following, a description will be given by using an XYZ coordinate system having an XY plane parallel to a wiring substrate 100 wherein such a coordinate system is an example of an orthogonal coordinate system. FIG. 1 illustrates a cross-section of the wiring substrate 100 taken along a plane parallel to the XZ plane and taken at the center point of the wiring substrate 100 in the Y-axis direction.

The wiring substrate 100 includes a core 110, a wiring layer 111A, through electrodes 120A and 120B, insulating layers 130A and 130B, and capacitor chips 200.

The wiring substrate 100 further includes vias 140A1, 140A2, 140A3, 140A4, 140A5, 140A6, 140B1, 140B2, 140B3, 140B4, 140B5, and 140B6.

The wiring substrate 100 further includes wiring layer segments 150A1, 150A2, 150A3, 150A4, 150A5, 150A6, 150B1, 150B2, 150B3, 150B4, 150B5, and 150B6, and also includes solder resist layers 160A and 160B.

In the following, for the sake of convenience of explanation, a surface facing upward in the drawings will be referred to as an upper surface, and a surface facing downward will be referred to as a lower surface. Moreover, terms "upward" and "downward" will be used for the sake of convenience of explanation. It may be noted, however, that terms such as "upper surface", "lower surface", "upward", "downward", "upper", and "lower" used in the description are not intended to indicate the permanent nature of upper and lower positions, but are simply used for the purpose of referring to upper and lower positions temporarily set in the drawings.

The core (i.e., core layer) 110 may be a glass cloth base material impregnated with epoxy resin having copper foils attached to the surfaces thereof, and serves as a core for a buildup substrate. One of the copper foils formed on the upper surface of the core 110 is patterned to form the wiring layer 111A. The other one of the copper foils formed on the lower surface of the core 110 may be patterned to form another wiring layer. If no wiring layer is necessary on the lower surface of the core 110, a copper foil suffices to be attached only to the upper surface of the core 110.

The core 110 has a penetrating hole 110H formed therein. The penetrating hole 110H penetrates through the core 110 in the thickness direction thereof (i.e., in the Z-axis direction in FIG. 1). The inner wall of the penetrating hole 110H of the core 110 has a projecting part 110A that projects inwardly inside the penetrating hole 110H. The projecting part 110A is not situated on the cross-section illustrated in FIG. 1, so that dashed lines are used to depict the position of the projecting part 110A. The projecting part 110A will be explained later in connection with FIG. 2 and FIG. 3.

The wiring layer 111A is a metal layer formed on the upper surface of the core 110. The wiring layer 111A may be formed by patterning the copper foil attached to the upper surface of the core 110, for example. The wiring layer 111A has a hollow rectangular shape (i.e., rectangular loop shape) surrounding the opening of the penetrating hole 110H in a plan view (i.e., as viewed from above).

The through electrodes 120A and 120B are electrodes penetrating the core 110 in the thickness direction thereof. The through electrodes 120A and 120B are situated on opposite sides of the penetrating hole 110H, respectively. The through electrodes 120A and 120B are formed by filling with copper plating the through holes formed through the core 110 on the opposite sides of the penetrating hole 110H.

In this example, the through electrodes 120A and 120B have the configuration in which the through holes are filled with copper plating. Alternatively, through hole vias may be made by forming copper plating in a cylindrical shape on the inner wall of the through holes.

The insulating layer 130A is formed to cover the upper surfaces of the core 110, the wiring layer 111A, the through electrodes 120A and 120B, and the capacitor chips 200. The insulating layer 130A is formed by thermally curing a resin material such as an epoxy-based material or polyimide-based material through heating and application of pressure. It may be noted that the insulating layer 130A is formed after the insulating layer 130B is formed in the arrangement that is upside down relative to the arrangement illustrated in FIG. 1.

The insulating layer 130B may be made by using the same resin material as the resin material such as an epoxy-based or polyimide-based material that is used to form the insulating layer 130A. The insulating layer 130B is formed to cover the lower surfaces of the core 110, the through electrodes 120A and 120B, and the capacitor chips 200 after filling the penetrating hole 110H with molten resin. The insulating layer 130B is formed by thermally curing a resin material such as an epoxy-based material or polyimide-based material through heating and application of pressure.

The vias 140A1, 140A2, 140A3, 140A4, 140A5, and 140A6 are formed inside via holes formed through the insulating layer 130A. The vias 140A1, 140A2, and 140A3 are connected to the through electrode 120A, an electrode 202 of the left-hand-side capacitor chip 200 on the left-hand side thereof, and another electrode 202 of the left-hand-side capacitor chip 200 on the right-hand side thereof, respectively.

The vias 140A4, 140A5, and 140A6 are connected to an electrode 202 of the right-hand-side capacitor chip 200 on the left-hand side thereof, another electrode 202 of the right-hand-side capacitor chip 200 on the right-hand side thereof, and the through electrode 120B, respectively. The vias 140A1, 140A2, 140A3, 140A4, 140A5, and 140A6 are formed by copper plating films, for example.

The vias 140B1, 140B2, 140B3, 140B4, 140B5, and 140B6 are formed inside via holes formed through the insulating layer 130B. The vias 140B1, 140B2, and 140B3 are connected to the through electrode 120A, an electrode 202 of the left-hand-side capacitor chip 200 on the left-hand side thereof, and another electrode 202 of the left-hand-side capacitor chip 200 on the right-hand side thereof, respectively.

The vias 140B4, 140B5, and 140B6 are connected to an electrode 202 of the right-hand-side capacitor chip 200 on the left-hand side thereof, another electrode 202 of the right-hand-side capacitor chip 200 on the right-hand side thereof, and the through electrode 120B, respectively. The vias 140B1, 140B2, 140B3, 140B4, 140B5, and 140B6 are formed by copper plating films, for example.

The wiring layer segments 150A1, 150A2, 150A3, 150A4, 150A5, and 150A6 are formed on the upper surface of the insulating layer 130A, and are connected to the vias 140A1, 140A2, 140A3, 140A4, 140A5, and 140A6, respectively. The wiring layer segments 150A1, 150A2, 150B3, 150A4, 150A5, and 150A6 are formed by copper plating films, for example.

The wiring layer segments 150B1, 150B2, 150B3, 150B4, 150B5, and 150B6 are formed on the lower surface of the insulating layer 130B, and are connected to the vias 140B1, 140B2, 140B3, 140B4, 140B5, and 140B6, respectively. The wiring layer segments 150B1, 150B2, 150B3, 150B4, 150B5, and 150B6 are formed by copper plating films, for example.

The solder resist layer 160A is formed on the insulating layer 130A and on the wiring layer segments 150A1, 150A2, 150A3, 150A4, 150A5, and 150A6. Portions of the wiring layer segments 150A1, 15012, 15013, 15014, 15015, and 15016 that are exposed through the solder resist layer 160A are employed as terminals.

The solder resist layer 160B is formed beneath the insulating layer 130B and beneath the wiring layer segments 150B1, 150B2, 150B3, 15034, 150B5, and 150B6. Portions of the wiring layer segments 150B1, 150B2, 150B3, 15034, 150B5, and 150B6 that are exposed through the solder resist layer 160B are employed as terminals.

The capacitor chips 200 are an example of electronic components, and two of them are disposed inside the penetrating hole 110H. Each of the two capacitor chips 200 has a main body 201 and a pair of electrodes 202. The main body 201 is made of ceramic, for example, and supports the electrodes 202 disposed on opposite sides thereof, respectively. The permittivity of the capacitor chips 200 is determined by the material of the main body 201.

Each of the electrodes 202 is larger than the main body 201 in the YZ-plan view (i.e., as viewed from the X-axis direction), such that the electrode projects from the main body 201 in the positive Y direction and the negative Y direction as well as in the positive Z direction and the negative Z direction. Further, the electrodes 202 are formed to cover the surface of the main body 201 facing toward the positive X direction and the surface of the main body 201 facing toward the negative X direction, respectively. Namely, the electrodes 202 are formed in a cap shape to cover the main body 201 of a cuboid shape in the positive X direction and the negative X direction, respectively.

One of the two capacitor chips 200 is disposed in such an area of the penetrating hole 110H as is situated further toward the negative X direction than a pair of projecting parts 110A. The other one of the two capacitor chips 200 is disposed in such an area of the penetrating hole 110H as is situated further toward the positive X direction than the pair of projecting parts 110A.

Further, each of the capacitor chips 200 is supported on the side surfaces and lower surface thereof by the insulating layer 130B, and are supported on the upper surface thereof by the insulating layer 130A.

The two capacitor chips 200 are arranged side by side in the X-axis direction such that the two electrodes 202 of each of the capacitor chips 200 face toward the positive X direction and the negative X direction, respectively. The capacitor chips 200 are spaced apart and insulated from each other.

In the following, FIGS. 2A through 2C and FIGS. 3A and 3B will be referred to in order to describe the penetrating hole 110H of the core 110.

Figure 2A:
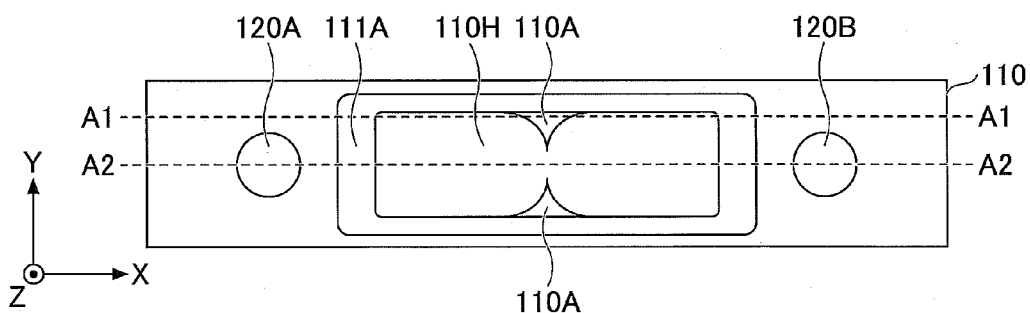
FIGS. 2A through 2C are cross-sectional views of the core.
Figure 2B:
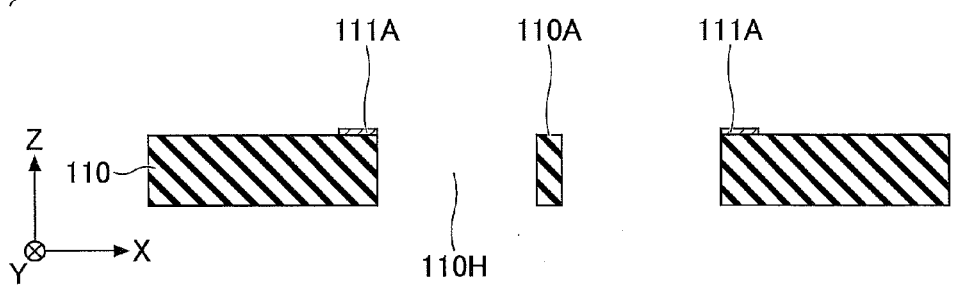
Figure 2C:
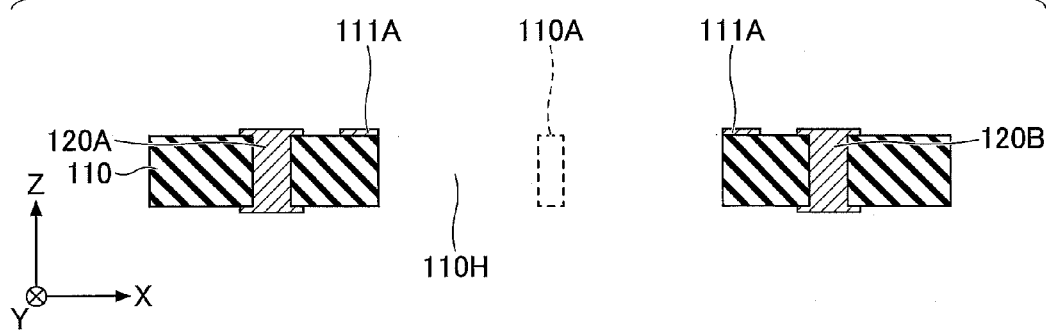

FIGS. 2A through 2C are cross-sectional views of the core 110. FIG. 2A illustrates a plan view (i.e., a view of the XY plane). FIGS. 2B and 2C illustrate cross-sections taken along planes parallel to the XZ plane.

FIG. 2B depicts a cross-section taken along a line A1-A1 illustrated in FIG. 2A as viewed from the negative Y direction. FIG. 2C depicts a cross-section taken along a line A2-A2 illustrated in FIG. 2A as viewed from the negative Y direction. The cross-section illustrated in FIG. 2C is parallel to the XZ plane and corresponds to the view illustrated in FIG. 1. Specifically, the cross-section illustrated in FIG. 2C is parallel to the XZ plane and taken at the center point of the core 110 in the Y-axis direction. FIGS. 2A through 2C illustrate the core 110 together with the wiring layer 111A and the through electrodes 120A and 120B.

As was previously described, the core 110 is formed of a glass-cloth base material impregnated with epoxy resin, and serves as a core for a buildup substrate. The core 110 has the penetrating hole 110H penetrating therethrough in the thickness direction.

The penetrating hole 110H has the inner wall thereof having the projecting parts 110A. The projecting parts 110A extend inwardly in the penetrating hole 110H, from both the inner wall facing toward the positive Y direction and the inner wall facing toward the negative Y direction, at such a center point of the penetrating hole 110H as defined in the X-axis direction (i.e., in the longitudinal direction of the penetrating hole 110H). The projecting parts 110A taper toward the tips thereof in the plan view as illustrated in FIG. 2A.

The inner walls of the penetrating hole 110H extend vertically in parallel to the Z axis. In the plan view, the two projecting parts 110A extend inwardly in the penetrating hole 110H and taper toward the tips thereof in the plan view.

The two penetrating holes 110H are provided for the purpose of suppressing positional displacement of the two capacitor chips 200 when the capacitor chips 200 are placed inside the penetrating hole 110H. The inner space of the penetrating hole 110H is divided by the two opposing projecting parts 110A into the area situated toward the positive X direction and the area situated toward the negative X direction. These two areas accommodate the two capacitor chips 200, respectively. Each of the two areas is an example of a placement area.

Each of the projecting parts 110A is formed by retaining a portion of the core 110 that is not removed when the penetrating hole 110H is formed by routing.

Figure 3A:
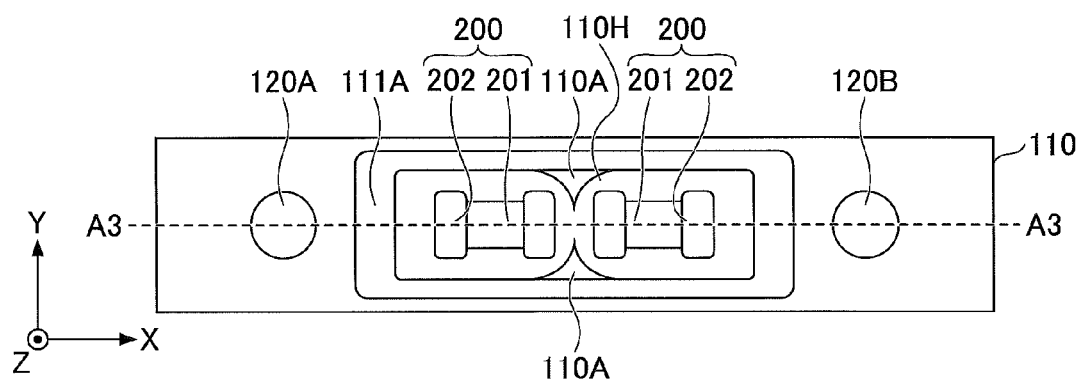
FIGS. 3A and 3B are drawings illustrating an arrangement in which capacitor chips are disposed in a penetrating hole of the core.
Figure 3B:
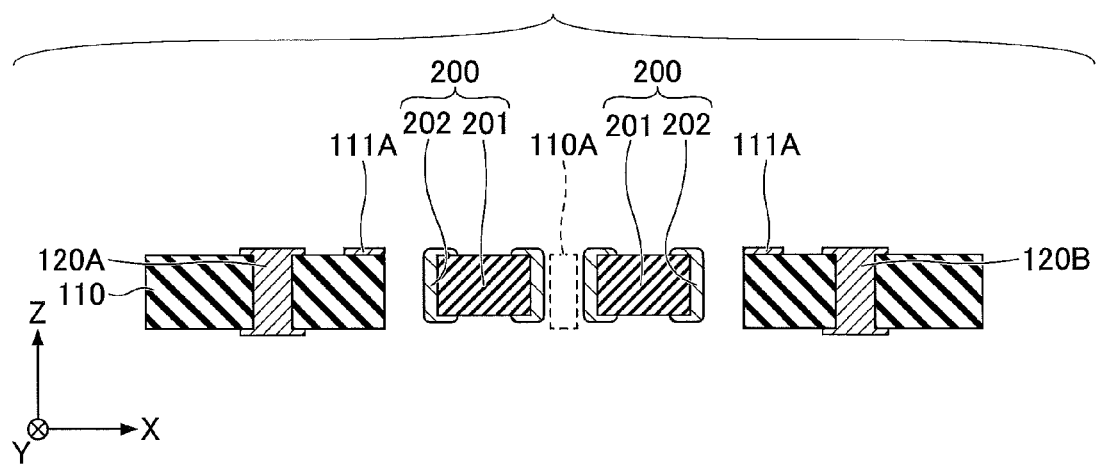

FIGS. 3A and 3B are drawings illustrating an arrangement in which the capacitor chips 200 are disposed in the penetrating hole 110H of the core 110. In reality, the capacitor chips 200 are supported by the insulating layers 130A and 130B and the like as illustrated in FIG. 1. In FIG. 3, the positions of the two capacitor chips 200 as would be arranged inside the penetrating hole 110H are illustrated without the insulating layers 130A and 130B.

FIGS. 3A and 3B are a plan view and a cross-sectional view corresponding to FIGS. 2A and 2C, respectively. FIG. 3B illustrates a cross-sectional view that is taken along a line A3-A3 in FIG. 3A and that is viewed from the negative Y direction. The cross-section illustrated in FIG. 3B is parallel to the XZ plane and corresponds to the view illustrated in FIG. 1. Specifically, the cross-section illustrated in FIG. 3B is parallel to the XZ plane and taken at the center point of the core 110 in the Y-axis direction.

The two capacitor chips 200 are placed in the area situated toward the positive X direction and the area situated toward the negative X direction, respectively, which are demarcated as areas distinct from each other by the two opposing projecting parts 110A in the penetrating hole 110H as illustrated in FIG. 3A.

The length of the area of the penetrating hole 110H situated on the positive X side of the projecting parts 110A and the length of the area of the penetrating hole 110H situated on the negative X side are each set longer than the length of a capacitor chip 200 in the X-axis direction. Further, the width of the penetrating hole 110H in the Y-axis direction other than the position at which the projecting parts 110A are situated is set wider than the width of a capacitor chip 200 in the Y-axis direction.

The gap in the Y-axis direction between the two opposing projecting parts 110A is set narrower than the width of a capacitor chip 200 in the Y-axis direction.

This arrangement is made for the purpose of suppressing the displacement, in the X-axis direction, of the capacitor chips 200 placed in the penetrating hole 110H, thereby preventing the capacitor chips 200 from intruding into each other's territory.

Since the capacitor chips 200 are arranged side by side in the X-axis direction, movement in the X-axis direction may cause the electrodes 202 to come in contact with each other, or may prevent the electrodes 202 from being properly connected to the vias 140A2 through 140A5 and 140B2 through 140B5.

As described above, the wiring substrate 100 of the present embodiment is provided with the projecting parts 110A projecting from the inner walls of the penetrating hole 110H situated sideways relative to the direction in which the two capacitor chips 200 are arranged side by side. With this arrangement, movement of any one of the capacitor chips 200 toward the other one of the capacitor chips 200 results in the capacitor chip 200 coming in contact with the projecting parts 110A so that the displacement thereof is suppressed.

Further, the difference between the length of a capacitor chip 200 in the X-axis direction and the length of the area of the penetrating hole 110H situated further toward the positive X direction than the projecting parts 110A and the difference between the length of a capacitor chip 200 in the X-axis direction and the length of the area of the penetrating hole 110H situated further toward the negative X direction than the projecting parts 110A are set smaller than the tolerable positional displacement of the electrodes 202 of the capacitor chips 200 relative to the vias 140A2 through 140A5 and 140B2 through 140B5.

Similarly, the difference between the width of the capacitor chips 200 in the Y-axis direction and the width of the penetrating hole 110H in the Y-axis direction at positions other than the position of the projecting parts 110A is set smaller than the tolerable positional displacement of the electrodes 202 of the capacitor chips 200 relative to the vias 140A2 through 140A5 and 140B2 through 140B5.

This arrangement is made for the purpose of ensuring connection between the electrodes 202 and the vias 140A2 through 140A5 and 140B2 through 140B5.

In the following, a method of making the wiring substrate 100 of the present embodiment will be described by referring to FIGS. 4A through 4E and FIGS. 5A through 5C. Further, a method of mounting an LSI (large scale integrated) circuit chip on the wiring substrate 100 will be described by referring to FIG. 6.

FIGS. 4A through 4E and FIGS. 5A through 5C illustrate the method of making the wiring substrate 100 of the present embodiment. Cross-sections described in the following correspond to the cross-sections illustrated in FIG. 1, FIG. 2C, and FIG. 3B. Namely, these cross-sections correspond to the plane parallel to the XZ plane and situated at the center of the wiring substrate 100 in the Y-axis direction.

Figure 4A:
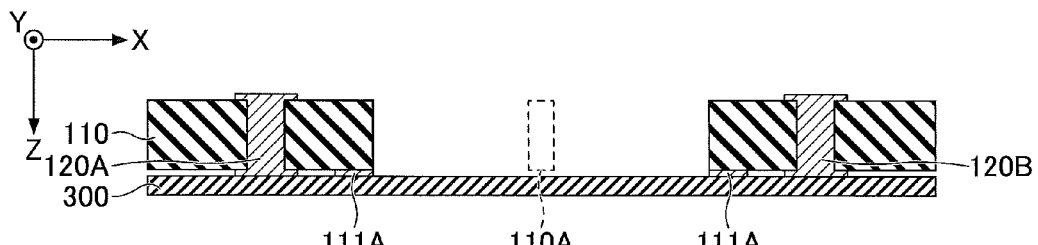
FIGS. 4A through 4E are drawings illustrating a method of making the wiring substrate of the embodiment.

As illustrated in FIG. 4A, the penetrating hole 110H is formed through the core 110 by routing, and, then, with the core 110 placed upside down, a tentative tape 300 is attached to the surface of the core 110 on which the wiring layer 111A is formed. The tentative tape 300 has an adhesive layer on a surface thereof that is the upper surface in FIG. 4A. The tentative tape 300 may be made of a resin film such as PET (Polyethylene terephthalate).

Figure 4B:
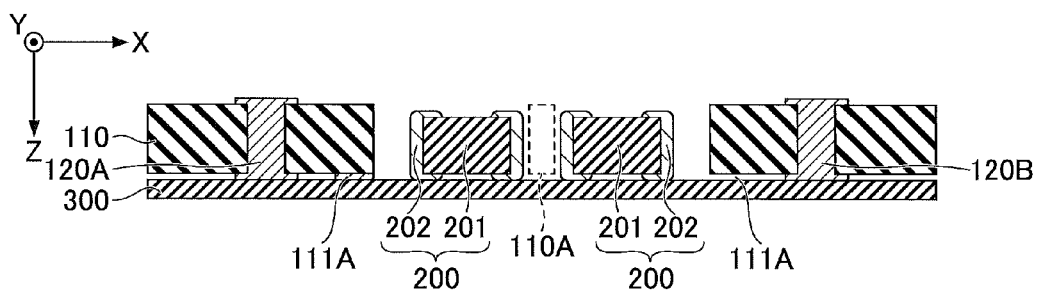

As illustrated in FIG. 4B, the capacitor chips 200 are inserted into the penetrating hole 110H of the core 110. In this state, the capacitor chips 200 are bonded to the tentative tape 300. This serves to secure the capacitor chips 200 tentatively.

Figure 4C:
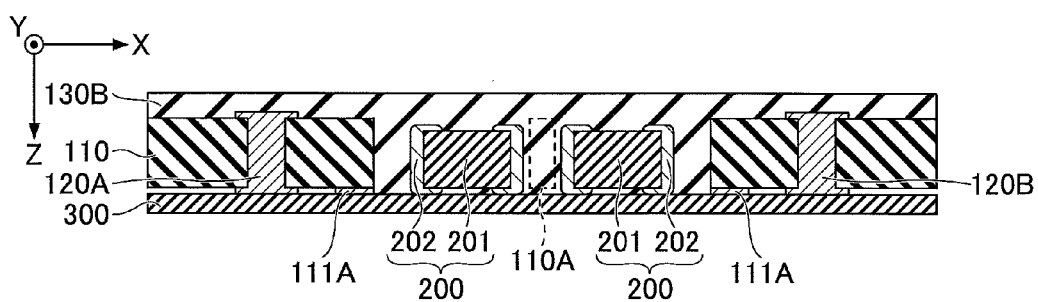

As illustrated in FIG. 4C, molten resin material is used to fill the penetrating hole 110H and also to cover the core 110, the through electrodes 120A and 120B, and the capacitor chips 200. In so doing, a resin film is placed on the core 110 to cover the penetrating hole 110H, and is melted by heat. The resin material is then heated and subjected to pressure to thermally cure, thereby forming the insulating layer 130B.

In this process step, the positional displacement of the capacitor chips 200 in the X-axis direction is suppressed by the projecting parts 110A, and the capacitor chips 200 are tentatively secured by the tentative tape 300, so that the positional displacement of the capacitor chips 200 are sufficiently reduced. Physical contact between the capacitor chips 200 is thus prevented to ensure insulation between the capacitor chips 200.

The wiring layer 111A has a hollow rectangular shape (i.e., rectangular loop shape) in the plan view to surround the penetrating hole 110H, so that the insulating layer 130B is prevented from entering areas outside the wiring layer 111A. If the intrusion of the insulating layer 130B is not a problem or does not occur, the wiring layer 111A fully circling around the penetrating hole 110H does not have to be provided.

Figure 4D:
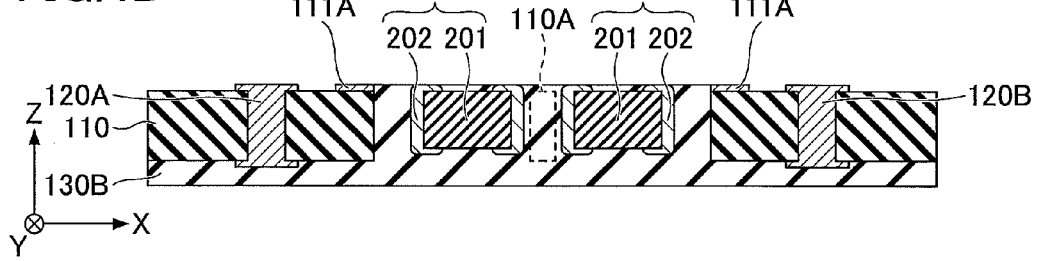

Subsequently, the tentative tape 300 is removed, followed by flipping over the core 110 again as illustrated in FIG. 4D.

Figure 4E:
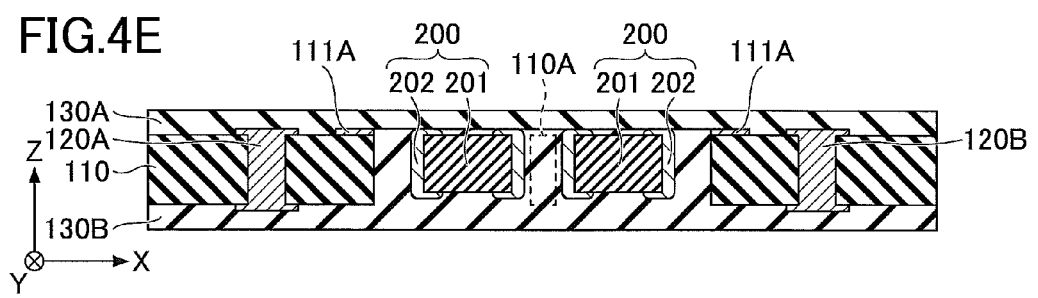

As illustrated in FIG. 4E, the insulating layer 130A is formed to cover the upper faces of the core 110, the wiring layer 111A, the through electrodes 120A and 120B, and the capacitor chips 200. The insulating layer 130A is formed by heating and applying pressure to the same resin material as that of the insulating layer 130B for thermal curing.

In this process step, the positional displacement of the capacitor chips 200 in the X-axis direction is suppressed by the projecting parts 110A, and the capacitor chips 200 are supported by the insulating layer 130B, so that the positional displacement of the capacitor chips 200 are sufficiently reduced. Physical contact between the capacitor chips 200 is thus prevented to ensure insulation between the capacitor chips 200. In the process steps illustrated in FIG. 4C through 4E, the capacitor chips 200 are encapsulated in the insulating layers 130A and 130B.

Figure 5A:
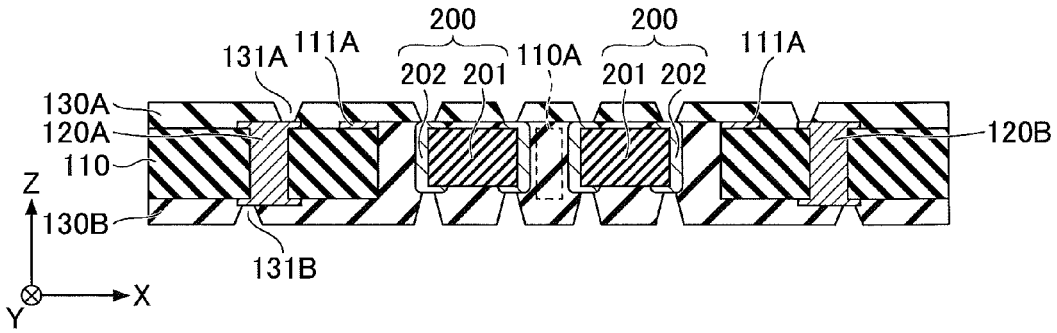
FIGS. 5A through 5C are drawings illustrating a method of making the wiring substrate of the embodiment.

Subsequently, via holes 131A and 131B are formed as illustrated in FIG. 5A. The via holes 131A are formed by a laser process, for example, at the positions where the vias 140A1 through 140A6 will be formed later. With the core 110 being flipped over, the via holes 131B are formed by a laser process, for example, at the positions where the vias 140B1 through 140B6 will be formed later.

Figure 5B:
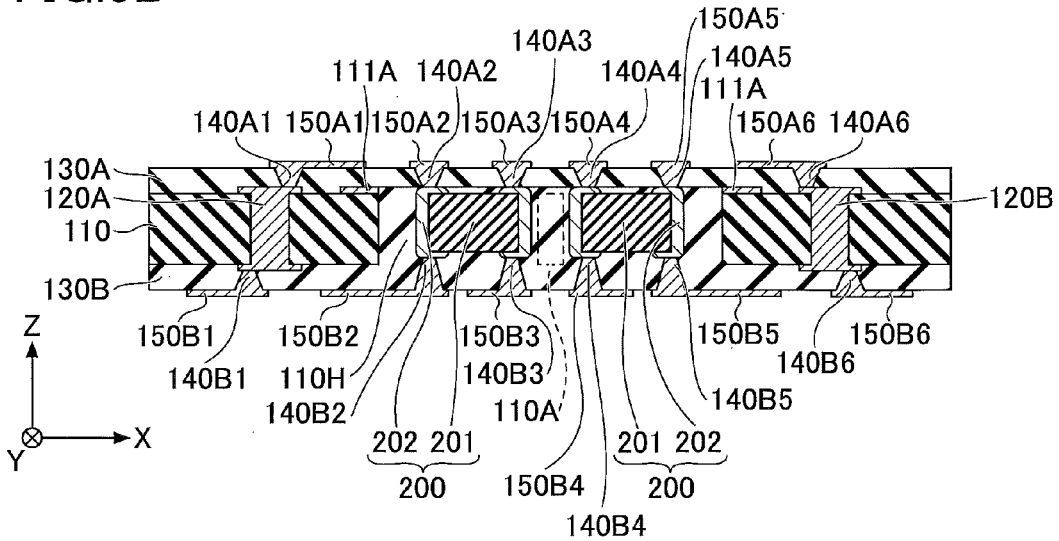

As illustrated in FIG. 5B, the vias 140A1 through 140A6, the vias 140B1 through 140B6, the wiring layer segments 150A1 through 150A6, and the wiring layer segments 150B1 through 150B6 are formed.

The vias 140A1 through 140A6 and the vias 140B1 through 140B6 may be formed inside the via holes 131A and 131B, respectively, by use of a semi-additive process, for example, The vias 140A1 through 140A6 are formed simultaneously, and the vias 140B1 through 140B6 are formed simultaneously.

The wiring layer segments 150A1 through 150A6 and the wiring layer segments 150B1 through 150B6 are formed integrally with the vias 140A1 through 140A6 and the vias 140B1 through 140B6, respectively, by use of a semi-additive method performed immediately after the plating process forming these vias.

Figure 5C:
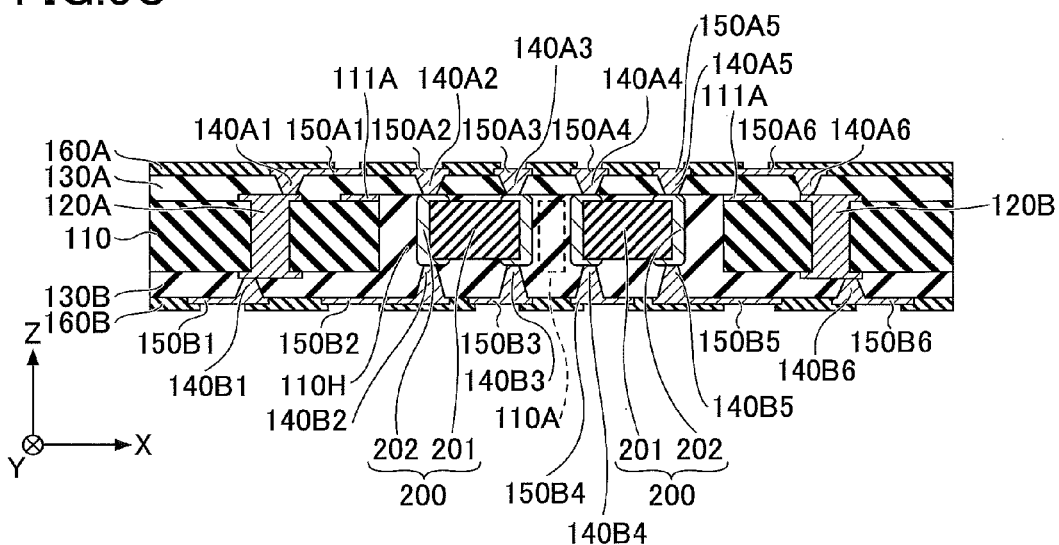

Subsequently, the solder resist layers 160A and 160B are formed as illustrated in FIG. 5C.

The solder resist layer 160A is formed by placing resist material all over the insulating layer 130A and the wiring layer segments 150A1 through 150A6 and by exposing through exposure and development processes the portions of the wiring layer segments 150A1 through 150A6 that are to be used as terminals. The resist material is photosensitive epoxy resin or photosensitive acrylic resin.

Similarly, the solder resist layer 160B is formed by placing resist material all over the insulating layer 130B and the wiring layer segments 150B1 through 150B6 and by exposing through exposure and development processes the portions of the wiring layer segments 150B1 through 150B6 that are to be used as terminals.

With this, the process of making the wiring substrate 100 of the present embodiment comes to an end.

Figure 6:
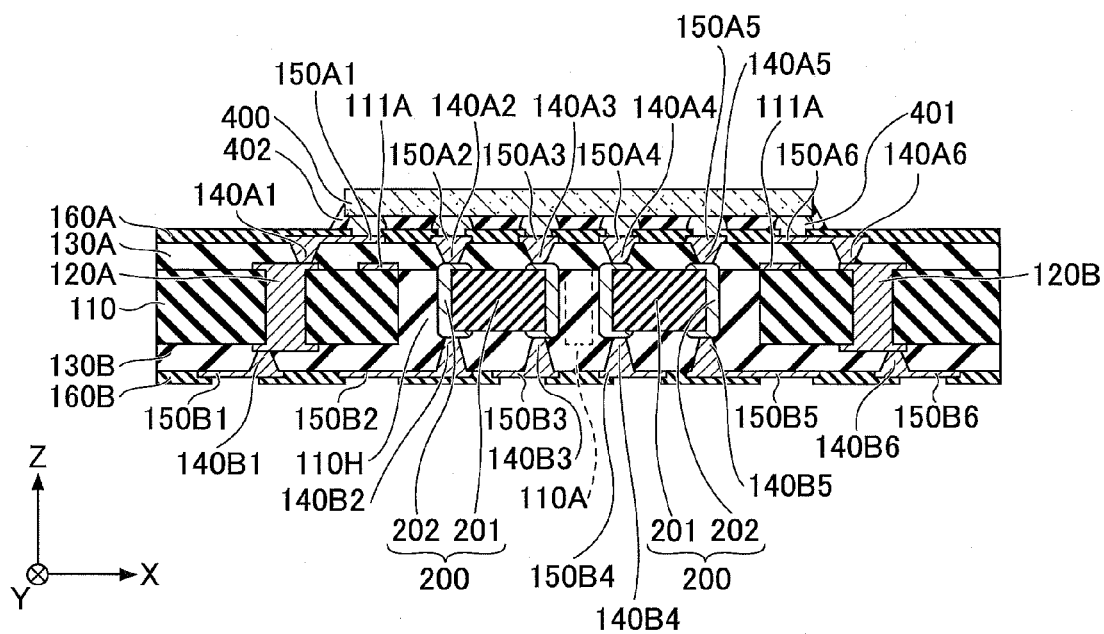
FIG. 6 is a drawing illustrating the wiring substrate and an LSI chip formed thereon.

FIG. 6 is a drawing illustrating the wiring substrate 100 and an LSI chip 400 formed thereon.

As illustrated in FIG. 6, the LSI chip 400 may be mounted through bumps 401 on the portions of the wiring layer segments 150A1 through 150A6 that are used as terminals. Underfill resin 402 may be placed to fill the gap under the LSI chip 400.

According to the present embodiment, the insulating layers 130A and 130B and the solder resist layers 160A and 160B are formed while the positional displacement of the capacitor chips 200 is suppressed by the projecting parts 110A of the inner walls of the penetrating hole 110H.

This arrangement suppresses the positional displacement of the capacitor chips 200 arranged side by side in the X-axis direction, thereby preventing short-circuiting caused by physical contact between the electrodes 202, and also preventing the electrodes 202 from failing to be properly connected to the vias 140A2 through 140A5 and the vias 140B2 through 140B5.

Accordingly, the wiring substrate 100 and a method of making the wiring substrate 100 are provided that improve electrical reliability with respect to the two capacitor chips 200 disposed in the single penetrating hole 110H.

It may be noted that mounting a semiconductor chip such as a CPU operating at high frequency on the wiring substrate 100 may require a large number of capacitor chips 200 to be used for the purpose of improving electrical characteristics.

Each capacitor chip 200 may be disposed in a different penetrating hole 110H when providing a large number of capacitor chips 200. Such an arrangement, however, ends up having a large number of penetrating holes 110H, which occupy a large area in the wiring substrate 100. The presence of such penetrating holes 110H means reduced freedom in wiring placement. Further, since a large number of penetrating holes 110H are provided, the horizontal area size of the wiring substrate 100 may need to be increased.

In order to obviate the problems noted above, the present embodiment uses a single penetrating hole 110H to accommodate a plurality of capacitor chips 200.

Provision may be made such that a plurality of penetrating holes 110H are provided.

The description provided heretofore has been directed to a case in which the two capacitor chips 200 are disposed in the single penetrating hole 110H. This is not a limiting example, and the number of capacitor chips 200 disposed in the single penetrating hole 110H may be any number that is two or more. In the case of three or more capacitor chips 200 being disposed in a single penetrating hole 110H, it suffices to form projecting parts 110A at each border between areas in which the capacitor chips 200 are disposed.

The description provided heretofore has also been directed to a case in which the capacitor chips 200 are disposed in the penetrating hole 110H. This is not a limiting example. What is disposed in the penetrating hole 110H is not limited to the capacitor chips 200, and may be any electronic components that have terminals or the like on an outer face thereof. For example, a plurality of CPU (central processing unit) chips or memory chips may be disposed in the penetrating hole 110H.

Further, the description provided heretofore has been directed to a case in which the penetrating hole 110H is formed by routing, and the projecting parts 110A are portions of the core 110 remaining after the routing. This is not a limiting example, and the penetrating hole 110H may be formed by a laser process or by another mechanical process.

Further, the description provided heretofore has been directed to the wiring substrate 100 in which only the insulating layers 130A and 130B are formed on the upper surface and lower surface of the core 110, respectively, as insulating layers. This is not a limiting example, and the wiring substrate 100 may include one or more other insulating layers in addition to the insulating layers 130A and 130B, and may also include a plurality of wiring layers.

FIGS. 7A through 7G are drawings illustrating variations of the penetrating hole of the embodiment. Penetrating holes 110H1 through 110H7 illustrated in FIGS. 7A through 7G, respectively, may be used in place of the penetrating hole 110H illustrated in FIG. 2A and FIG. 3A. FIGS. 7A through 7G also illustrate the capacitor chips 200.

Figure 7A:
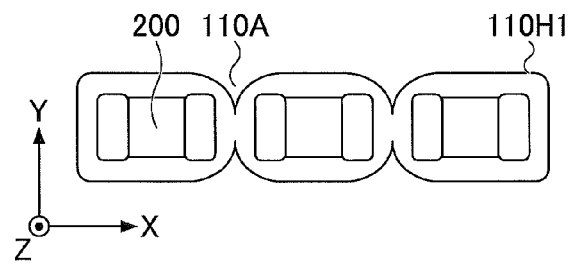
FIGS. 7A through 7G are drawings illustrating variations of the penetrating hole of the embodiment.

As in the case of the penetrating hole 110H1 illustrated in FIG. 7A, the penetrating hole may be formed to have a prolonged length in the X-axis direction so as to accommodate three capacitor chips 200, with two pairs of projecting parts 110A that divide the penetrating hole into three areas.

Figure 7B:
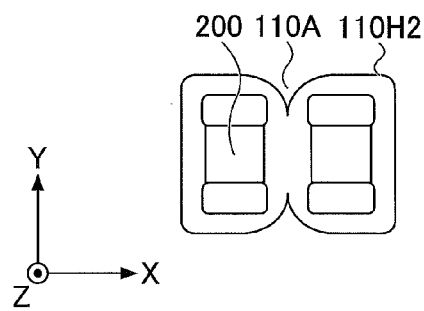

As in the case of the penetrating hole 110H2 illustrated in FIG. 7B, the penetrating hole may be formed to have a shortened length in the X-axis direction and a broadened width in the Y-axis direction so as to accommodate two capacitor chips 200 arranged side by side in their width direction (i.e., short-side direction), with a pair of projecting parts 110A that divides the penetrating hole into two areas.

Figure 7C:
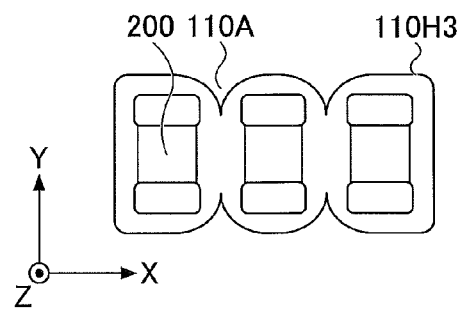

As in the case of the penetrating hole 110H3 illustrated in FIG. 7C, the penetrating hole may be formed to accommodate three capacitor chips 200 arranged side by side in their width direction (i.e., short-side direction), with two pairs of projecting parts 110A that divide the penetrating hole into three areas.

Figure 7D:
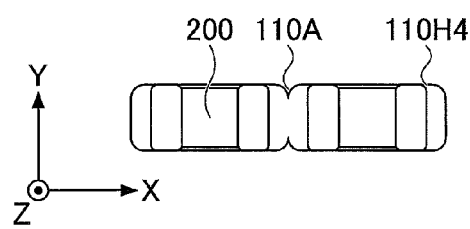

As in the case of the penetrating hole 110H4 illustrated in FIG. 7D, the penetrating hole may be formed to have the width thereof in the Y-axis direction substantially equal to the width of capacitor chips 200 in the Y-axis direction, such that the two capacitor chips 200 are engaged with the inner walls of the penetrating hole facing toward each other in the Y-axis direction.

Figure 7E:
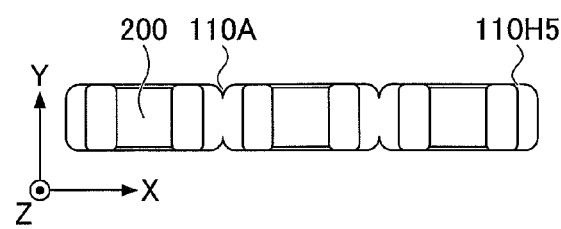

As in the case of the penetrating hole 110H5 illustrated in FIG. 7E, the penetrating hole 110H4 illustrated in FIG. 7D may be elongated in the X-axis direction to accommodate three capacitor chips 200, with two pairs of projecting parts 110A being formed that divide the penetrating hole into three areas.

Figure 7F:
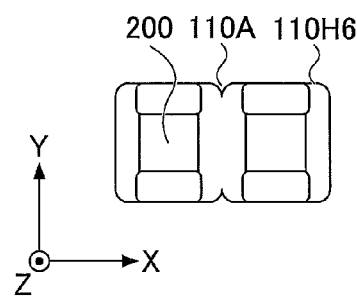

As in the case of the penetrating hole 110H6 illustrated in FIG. 7F, the penetrating hole H4 illustrated in FIG. 7D may be modified to have a shortened length in the X-axis direction and a broadened width in the Y-axis direction so as to accommodate two capacitor chips 200 arranged side by side in their width direction (i.e., short-side direction).

Figure 7G:
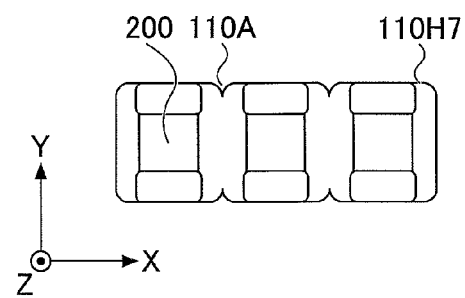

As in the case of the penetrating hole 110H7 illustrated in FIG. 7G, the penetrating hole 110H6 illustrated in FIG. 7F may be elongated in the X-axis direction to accommodate three capacitor chips 200, with two pairs of projecting parts 110A being formed that divide the penetrating hole into three areas.

A description provided heretofore is directed to an example in which the penetrating holes 110H and 110H1 through 110H7 are formed by a mechanical process such as routing. Alternatively, such holes may be formed by a laser process. A relevant description will be given by referring to FIGS. 8A and 8B and FIGS. 9A through 9C.

Figure 8A:
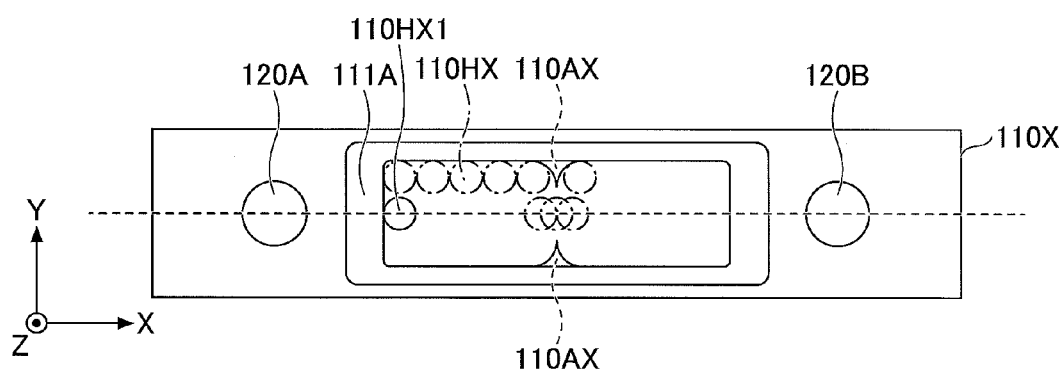
FIGS. 8A and 8B are drawings illustrating processes for forming a penetrating hole by use of a laser beam.
Figure 8B:
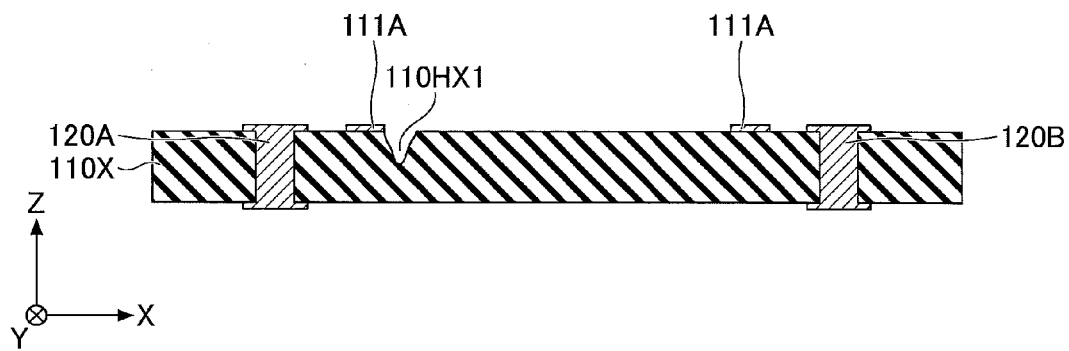

FIGS. 8A and 8B are drawings illustrating processes for forming a penetrating hole 110HX by use of a laser beam.

As illustrated in FIGS. 8A and 8B, a core 110X having the wiring layer 111A and the through electrodes 120A and 120B is provided, and, then, a laser process is utilized to form the penetrating hole 110HX.

For example, the diameter and power of the laser beam are set such that one laser shot creates a hole 110HX1 as illustrated in FIGS. 8A and 8B. The hole 110HX1 may be approximately one third of the width of the penetrating hole 110HX in the Y-axis direction as illustrated in FIG. 8A, and may have a depth slightly deeper than half the thickness of the core 110X. As illustrated in FIG. 8B, the hole 110HX1 has a cross-section thereof whose horizontal span decreases toward the bottom. Such a shape of the hole 110HX1 is made by a laser process.

The position of a laser shot is shifted successively as illustrated by chain-line circles illustrated in FIG. 8A in the area where the penetrating hole 110HX is created, and, then, the core 110X is flipped over for a similar laser process to be performed, thereby creating the penetrating hole 110HX.

When laser shots impact on the core 110 from both surfaces thereof, the diameter and power of the laser beam may be adjusted to leave projecting part 110AX on the inner walls of the penetrating hole 110HX. With this arrangement, the penetrating hole 110HX having the projecting part 110AX is formed in the core 110X.

In the example described above, the penetrating hole 110HX is formed through the core 110X having the wiring layer 111A and the through electrodes 120A and 120B. Alternatively, the penetrating hole 110HX may be formed first through the core 110X, and, then, the wiring layer 111A and the through electrodes 120A and 120B may be formed.

The penetrating hole 110HX and the projecting parts 110AX formed by a laser process as described above have shapes as illustrated in FIGS. 9A through 9C.

Figure 9A:
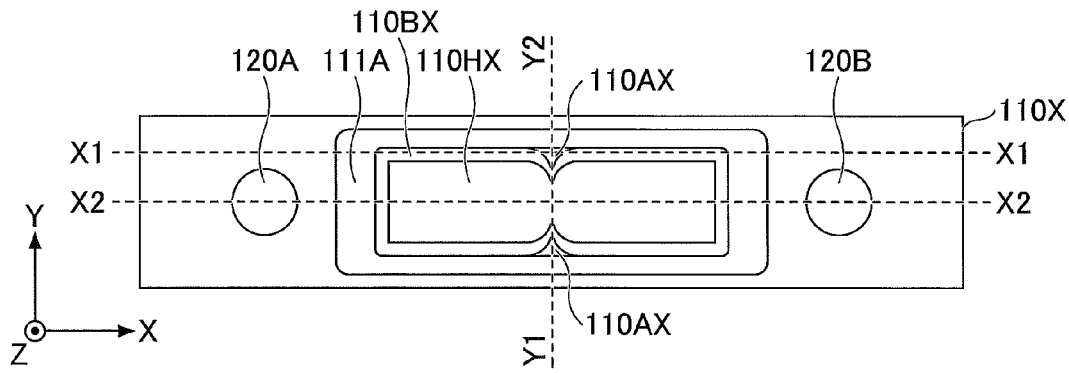
FIGS. 9A through 9D illustrate the penetrating hole formed through the core by a laser process.
Figure 9B:
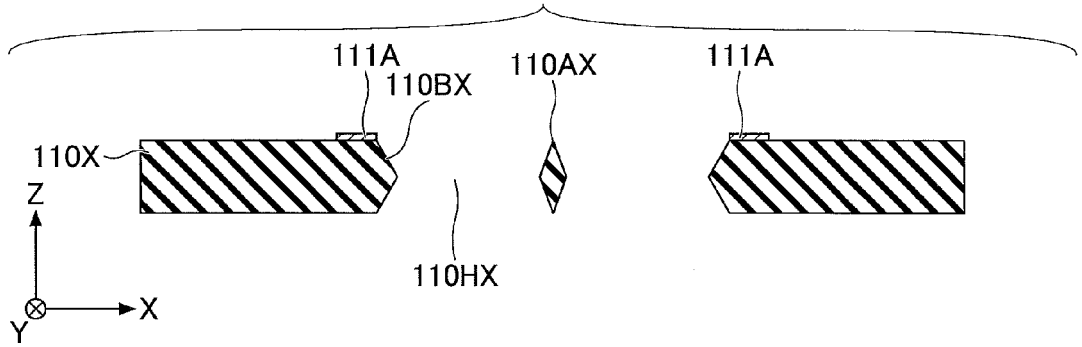
Figure 9C:
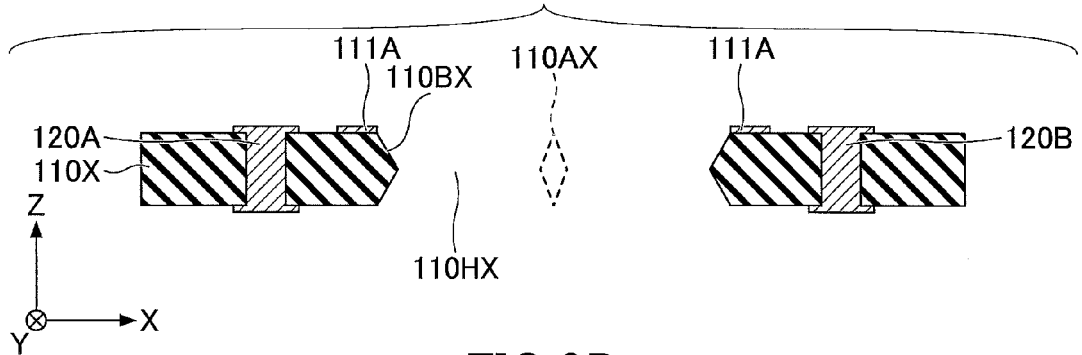

FIGS. 9A through 9C illustrate the penetrating hole 110HX formed through the core 110X by a laser process. FIG. 9A is a plan view (i.e., a view of the XY plane), and FIG. 9B illustrates a cross-section taken along a line X1-X1 in FIG. 9A as viewed from the negative Y direction. FIG. 9C depicts a cross-section taken along a line X2-X2 illustrated in FIG. 9A as viewed from the negative Y direction. The cross-section illustrated in FIG. 9C is parallel to the XZ plane and corresponds to the view illustrated in FIG. 1. Specifically, the cross-section illustrated in FIG. 9C is parallel to the XZ plane and taken at the center point of the core 110X in the Y-axis direction. FIGS. 9A through 9C illustrates the core 110X together with the wiring layer 111A and the through electrodes 120A and 120B.

The inner walls 110BX of the penetrating hole 110HX of the core 110X project toward the inner space of the penetrating hole 110HX in the plan view, and has a cross-section thereof formed in a tapered shape as illustrated in FIG. 9B and FIG. 9C. The inner walls 110BX projecting in a tapered shape are formed along the perimeter of the penetrating hole 110HX to form a rectangular loop. The inner walls 110BX have the most projecting part thereof at the center point of the core 110X as defined in the thickness direction (i.e., in the Z-axis direction), so that the most projecting part forms ridges.

The inner wall 110BX facing toward the negative Y direction and the inner wall 110BX facing toward the positive Y direction project further toward the inner space of the penetrating hole 110HX at the center of the penetrating hole 110HX as defined in the X-axis direction than at any other parts of these inner walls 110BX, thereby forming the projecting parts 110AX.

As illustrated in FIGS. 9B and 9C, each projecting part 110AX has a rhombus shape as defined in the XZ plane, and has both the span in the X-axis direction and the span in the Z-axis direction decreasing toward the tip thereof. Namely, each projecting part 110AX has a tapered shape in the cross-section parallel to the YZ plane, and also has a tapered shape in the cross-section parallel to the XY plane.

Figure 9D:
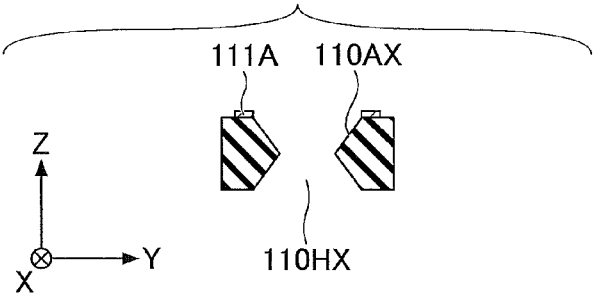

As illustrated in FIG. 9D, the projecting part 110AX having a tapered shape is configured such that the inner walls of the penetrating hole 110HX are not vertical to extend in the Z-axis direction, but are formed at an angle smaller than 90 degrees relative to the upper surface and lower surface of the core 110X, and such that the inner walls have the most projecting part at a general center thereof in the thickness direction of the core 110X projecting toward the inner space of the penetrating hole 110HX. A thickness of the projecting part 110AX in the thickness direction of the core 110X decreases toward a tip of the projecting part.

The descriptions of a wiring substrate and a method of making the wiring substrate according to exemplary embodiments have been provided heretofore. The present invention is not limited to these embodiments, but various variations and modifications may be made without departing from the scope of the present invention.

According to at least one embodiment, a wiring substrate and a method of making the wiring substrate are provided that ensure improved electrical reliability with respect to a plurality of electronic components disposed in a single penetrating hole.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention have been described in detail, it should be understood that the various changes, substitutions, and alterations could be made hereto without departing from the spirit and scope of the invention.

The disclosures herein include the following configurations.

Clause 1) A method of making a wiring substrate, comprising:

forming a hole penetrating through a core layer in a thickness direction thereof, such that a projecting part projects from an inner wall of the hole toward an inner space of the hole, the projecting part being situated at a border that divides a plurality of areas in the hole;

placing a plurality of electronic components in the areas, respectively, the electronic components being arranged at a spaced interval with the projecting part therebetween; and filling the hole with resin material to form a resin layer that supports the electronic components.

Clause 2) The method as recited in Clause 1, wherein the step of forming the hole forms the hole such that a thickness of the projecting part in the thickness direction of the core layer decreases toward a tip of the projecting part.

Clause 3) The method as recited in Clause 1, wherein the step of forming the hole forms the hole such that a width of the projecting part in the direction in which the areas are arranged side by side decreases toward a tip of the projecting part.

What is claimed is:

1. A wiring substrate, comprising:
a core layer having a hole penetrating therethrough in a thickness direction thereof, and having a projecting part projecting from an inner wall of the hole toward an inner space of the hole, the projecting part being situated at a border that divides a plurality of areas in the hole;
a plurality of electronic components disposed in the areas, respectively, the electronic components being arranged at a spaced interval with the projecting part therebetween; and
a resin layer filling the hole and supporting the electronic components,
wherein a thickness of the projecting part in the thickness direction of the core layer decreases toward a tip of the projecting part, and a central portion of the projecting part in the thickness direction of the core layer projects furthest into the hole, and
wherein the inner wall of the hole has a tapered cross-section in the thickness direction of the core layer, the tapered cross-section having a tip situated at a center in the thickness direction of the core layer, and the tapered cross-section is formed along an entire perimeter of the hole to project into the hole and also to form the projecting part situated at the border between the areas, the projecting part having a rhombus shape in a cross-section perpendicular to a direction in which the projecting part projects into the hole.

2. The wiring substrate as claimed in claim 1, wherein the hole has a rectangular shape in a plan view perpendicular to the thickness direction, and the projecting part situated at the border projects from each of two respective opposite inner walls, among the inner walls, situated sideways relative to a direction in which the areas are arranged side by side.

3. The wiring substrate as claimed in claim 2, wherein a gap between the projecting parts projecting from the two respective opposite inner walls is shorter than a width of the electronic components in a direction perpendicular to the direction in which the areas are arranged side by side.

4. The wiring substrate as claimed in claim 1, wherein a width of the projecting part in the direction in which the areas are arranged side by side decreases toward a tip of the projecting part.

5. The wiring substrate as claimed in claim 1, wherein each of the electronic components has a cuboid shape with electrodes disposed on opposite ends thereof opposite to each other in a longitudinal direction of the cuboid shape.

6. The wiring substrate as claimed in claim 1, wherein each of the electronic components has a cuboid shape, and the electronic components are arranged side by side in a longitudinal direction of the cuboid shape.

7. The wiring substrate as claimed in claim 1, wherein each of the electronic components has a cuboid shape, and the electronic components are arranged side by side in a direction perpendicular to a longitudinal direction of the cuboid shape.

8. The wiring substrate as claimed in claim 1, wherein the electronic components are capacitor chips.

9. The wiring substrate as claimed in claim 1, wherein a cross-section of the projecting part, perpendicular to a direction in which the areas are arranged side by side, has an upper edge extending at an angle relative to an upper surface of the core layer, and has a lower edge extending at an angle relative to a lower surface of the core layer.

10. The wiring substrate as claimed in claim 1, further comprising a wiring layer formed on an upper surface of the core layer at a perimeter of the hole, the wiring layer having a rectangular loop shape surrounding the hole in a plan view, and an outer perimeter edge of the rectangular loop shape is a rectangular shape enclosing only the hole and no other holes.

* * * * *